United States Patent
Guo et al.

(10) Patent No.: US 11,488,522 B2
(45) Date of Patent: Nov. 1, 2022

(54) DISPLAY SUBSTRATE AND METHOD FOR DRIVING THE SAME AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yonglin Guo, Beijing (CN); Yidan Zhu, Beijing (CN); Tingliang Liu, Beijing (CN); Yiran Li, Beijing (CN); Xinyu Wei, Beijing (CN); Kai Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/297,404

(22) PCT Filed: Aug. 31, 2020

(86) PCT No.: PCT/CN2020/112602
§ 371 (c)(1),
(2) Date: May 26, 2021

(87) PCT Pub. No.: WO2021/063142
PCT Pub. Date: Apr. 8, 2021

(65) Prior Publication Data
US 2022/0005409 A1    Jan. 6, 2022

(30) Foreign Application Priority Data

Sep. 30, 2019  (CN) .......................... 201910941509.9

(51) Int. Cl.
*G09G 3/00* (2006.01)
*G09G 3/3208* (2016.01)

(52) U.S. Cl.
CPC ........... *G09G 3/3208* (2013.01); *G09G 3/006* (2013.01); *G09G 2300/0809* (2013.01); *G09G 2320/0233* (2013.01); *G09G 2330/12* (2013.01)

(58) Field of Classification Search
CPC ................. G09G 3/3208; G09G 3/006; G09G 2300/0809; G09G 2320/0233; G09G 2330/12
See application file for complete search history.

(56) References Cited

U.S. PATENT DOCUMENTS

2013/0335397 A1* 12/2013 Kim .................... G09G 3/3233
                                                        345/82
2014/0239823 A1   8/2014 Ahn
(Continued)

FOREIGN PATENT DOCUMENTS

CN        104409046 A      3/2015
CN        106448562 A      2/2017
(Continued)

OTHER PUBLICATIONS

1st Chinese Office Action, English Translation.
(Continued)

*Primary Examiner* — Amare Mengistu
*Assistant Examiner* — Gloryvid Figueroa-Gibson
(74) *Attorney, Agent, or Firm* — Brooks Kushman P.C.

(57) ABSTRACT

A display substrate and a method for driving the display substrate are provided in the present disclosure. The display substrate includes a plurality of pixel units arranged in an array and a power supply signal structure configured to apply a power supply voltage signal to each pixel unit. The
(Continued)

power supply signal structure includes: a plurality of driving voltage signal VDD lines, a first power supply voltage signal VDD1 line connected to a first end of each driving voltage signal VDD line, and configured to apply a first power supply voltage V1 to the first end of the driving voltage signal line, and a second power supply voltage signal VDD2 line connected to a second end of the driving voltage signal VDD line, and configured to apply a power supply voltage V2 to the second end of the driving voltage signal VDD line.

19 Claims, 3 Drawing Sheets

(56) References Cited

U.S. PATENT DOCUMENTS

| | | | |
|---|---|---|---|
| 2016/0117987 | A1 | 4/2016 | Byun |
| 2016/0358545 | A1 | 12/2016 | Yin et al. |
| 2018/0047804 | A1 | 2/2018 | Zhou et al. |
| 2018/0330664 | A1* | 11/2018 | Ko .................. G09G 3/3208 |
| 2018/0350284 | A1 | 12/2018 | Park et al. |
| 2019/0164482 | A1 | 5/2019 | Wang et al. |

FOREIGN PATENT DOCUMENTS

| | | | |
|---|---|---|---|
| CN | 106875879 | A | 6/2017 |
| CN | 107808653 | A | 3/2018 |
| CN | 108986728 | A | 12/2018 |
| CN | 110648632 | A | 1/2020 |
| KR | 20150071840 | A | 6/2015 |

OTHER PUBLICATIONS

International Search Report and Written Opinion, English Translation.
CN104409046A, English Abstract and U.S. Equivalent U.S. Pub. No. 2016/0358545.
CN106448562A, English Abstract and U.S. Equivalent U.S. Pub. No. 2018/0330664.
CN106875879A, English Abstract and U.S. Equivalent U.S. Pub. No. 2018/0047804.
CN107808653A, English Abstract and U.S. Equivalent U.S. Pub. No. 2019/0161482.
CN108986728A, English Abstract and U.S. Equivalent U.S. Pub. No. 2018/0350284.
CN110648632A, English Abstract and Machine Translation.
KR20150071840A, English Abstract and Machine Translation.
Non-patent literature referenced entitled, "Analysis for Compensate of Brightness of OLED Pixel Circuit", English Abstract and Machine Translation.
Non-patent literature reference entitled, "Analysis of Typical Crosstalk in Passive Matrix Polymer Light Emitting Diodes", English Abstract and Machine Translation.
First Office Action for Chinese Application No. 201910941509.9, dated Jul. 21, 2020, 8 Pages.
International Search Report and Written Opinion for Application No. PCT/CN2020/112602, dated Nov. 25, 2020, 10 Pages.
He, Yi, "Analysis for Compensate of Brightness of OLED Pixel Circuit," Chinese Industrial Technology Innovation, Apr. 2016, pp. 269-271, vol. 3, No. 2, 3 Pages.
Zheng et al., "Analysis of Typical Crosstalk in Passive Matrix Polymer Light Emitting Diodes," Chinese Journal of Luminescence, Feb. 28, 2005, pp. 99-104, vol. 26, No. 1, 7 Pages.

* cited by examiner

DISPLAY SUBSTRATE AND METHOD FOR DRIVING THE SAME AND DISPLAY DEVICE

CROSS-REFERENCE TO RELATED APPLICATION APPLICATIONS

This application is the U.S. national phase of PCT Application No. PCT/CN2020/112602 filed on Aug. 31, 2020, which claims priority to Chinese Patent Application No. 201910941509.9 filed on Sep. 30, 2019, which are incorporated herein by reference in their entireties.

TECHNICAL FIELD

The present disclosure relates to the field of display technologies, in particular to a display substrate, a method for driving the display substrate and a display device.

BACKGROUND

In the related art, problems of differed driving voltages of pixel circuits at different positions causing nonuniform display brightness across an entire panel of organic light-emitting diode (OLED) display often occur

SUMMARY

A display substrate is provided, including: a plurality of gate lines, a plurality of data lines, a plurality of pixel units defined by the plurality of gate lines crossing the plurality of data lines and arranged in an array, and a power supply signal structure configured to apply a power supply voltage signal to each pixel unit. The power supply signal structure includes: a plurality of driving voltage signal VDD lines, a first power supply voltage signal VDD1 line connected to a first end of each driving voltage signal VDD line, and configured to apply a first power supply voltage V1 to the first end of the driving voltage signal line, and a second power supply voltage signal VDD2 line connected to a second end of the driving voltage signal VDD line, and configured to apply a power supply voltage V2 to the second end of the driving voltage signal VDD line.

For example, the display substrate includes a display region and a peripheral region, the display substrate includes a power supply input side and an opposite side opposite to the power supply input side, the power supply input side corresponds to the first end of the driving voltage signal VDD line, and the opposite side corresponds to the second end of the driving voltage signal VDD line. The first power supply voltage signal VDD1 line is arranged in the peripheral region of the display substrate and located at the power supply input side, and includes a first power supply input end and a first power supply output end, the first power supply input end is electrically connected to a driving integrated circuit (IC) of the display substrate, and the first power supply output end is electrically connected to the first end of each driving voltage signal VDD line.

For example, the second power supply voltage signal VDD2 line is arranged in the peripheral region of the display substrate, at least a part of the second power supply voltage signal VDD2 line is located at the power supply input side and includes a second power supply input end at the power supply input side, the second power supply input end is electrically connected to the driving IC of the display substrate, at least another part of the second power supply voltage signal VDD2 line is disposed around the display region and extends to the opposite side of the power supply input side, and includes a second power supply output end at the opposite side, and the second power supply output end is electrically connected to the second end of each driving voltage signal VDD line.

For example, the second power supply voltage signal VDD2 line includes a first horizontal line arranged at the power supply input side and configured to be electrically connected to the driving IC of the display substrate, where the first horizontal line is parallel to each gate line, and includes two second power supply input ends; a second horizontal line arranged at the opposite side and extending along a direction of each data line, where the second horizontal line is parallel to the gate line, and includes one second power supply output end corresponding to each driving voltage signal VDD line; and two vertical lines connected to two ends of the second horizontal line respectively, and parallel to the driving power supply voltage signal VDD line, where two ends of each vertical line are connected to the first horizontal line and the second horizontal line respectively.

For example, the first power supply voltage signal VDD1 line and the second power supply voltage signal VDD2 line are arranged at a same layer and made of a same material.

For example, the display substrate includes a display region and a peripheral region, the display substrate includes a power supply input side and an opposite side opposite to the power supply input side, the power supply input side corresponds to the first end of the driving voltage signal VDD line, and the opposite side corresponds to the second end of the driving voltage signal VDD line. The display substrate further includes an electrical test line configured to perform electrical test on the display substrate, and arranged in the peripheral region of the display substrate. The electrical test line includes a test signal input end and a test signal output end, the test signal input end is arranged at the power supply input side, at least a part of the electrical test line is disposed around the display region and extends to the opposite side to form a horizontal line in a same direction as each gate line, so as to reuse the electrical test line as the second power supply voltage signal VDD2 line, and a second switch is provided corresponding to each driving voltage signal VDD line.

For example, the test signal output end is connected to each driving voltage signal VDD line through a corresponding first switch.

For example, the electrical test line is a panel crack design line.

For example, the first switch is a first thin film transistor (TFT) switch, and the second switch is a second TFT switch. A gate electrode of the first TFT switch is connected to a first switch signal line configured to apply a switch control signal to the first TFT switch, a source electrode of the first TFT switch is connected to a data line, and a drain electrode of the first TFT switch is connected to the test signal input end of the electrical test line. A gate electrode of the second TFT switch is connected to a second switch signal line configured to apply a switch control signal to the second TFT switch, a source electrode of the second TFT switch is connected to the horizontal line of the electrical test line, and a drain electrode of the second TFT switch is connected to the driving voltage signal VDD line. The source electrode and the drain electrode of the first TFT switch and the source electrode and the drain electrode of the second TFT switch are arranged at a same layer and made of a same material, and the gate electrode of the first TFT switch and the gate electrode of the second TFT switch are arranged at a same layer and made of a same material.

For example, a value of the first power supply voltage V1 is substantially equal to a value of the second power supply voltage V2.

A method for driving the above-mentioned display substrate is further provided, including: applying a first power supply voltage signal to the first power supply voltage signal VDD1 line, such that the first power supply voltage signal VDD1 line applies the first power supply voltage V1 to the first end of the driving voltage signal line; and applying a second power supply voltage signal to the second power supply voltage signal VDD2 line, such that the second power supply voltage signal VDD2 line applies the second power supply voltage V2 to the second end of the driving voltage signal line.

For example, a value of the first power supply voltage V1 is substantially equal to a value of the second power supply voltage V2.

A method for driving the above-mentioned display substrate is further provided, including: during a display substrate test phase, turning on the first switch to connect the test signal output end with a data line, and turning off the second switch to disconnect the horizontal line of the electrical test line from the second end of the driving voltage signal VDD line, and apply a test electrical signal to the test signal input end; and during a pixel unit light-emitting phase, turning off the first switch to disconnect the test signal output end from the data line, and turning on the second switch, to connect the second end of the driving voltage signal VDD line with the horizontal line of the electrical test line, and apply a second power supply voltage signal to the test signal input end.

A display device is further provided, including: the above-mentioned display substrate, a memory and a processor. The memory is configured to store instructions, and the processor is configured to execute the instructions to control a value of the first power supply voltage V1 applied through the first power supply voltage signal VDD1 line in the display substrate to the first end of the driving voltage signal line to be substantially equal to a value of the second power supply voltage V2 applied through the second power supply voltage signal VDD2 line in the display substrate to the second end of the driving voltage signal VDD line.

For example, the processor is configured to: calculate a voltage drop value across the second power supply input end and the second power supply output end of the second power supply voltage signal VDD2 line; and according to the voltage drop value, control the driving IC to adjust at least one of power supply voltage signal values applied to the first power supply input end and the second power supply input end, to enable a value of the first power supply voltage V1 outputted by the first power supply output end to be substantially equal to a value of the second power supply voltage V2 outputted by the second power supply output end.

For example, the processor is configured to: during a test phase, turn on the first switch to connect the test signal output end with a data line, and turn off the second switch to disconnect the horizontal line of the electrical test line from the second end of the driving voltage signal VDD line, and apply a test electrical signal to the test signal input end; and during a pixel unit light-emitting phase, turn off the first switch to disconnect the test signal output end from the data line, and turn on the second switch to connect the second end of the driving voltage signal VDD line with the horizontal line of the electrical test line, and apply a second power supply voltage signal to the test signal input end.

DETAILED DESCRIPTION

Figure 1:
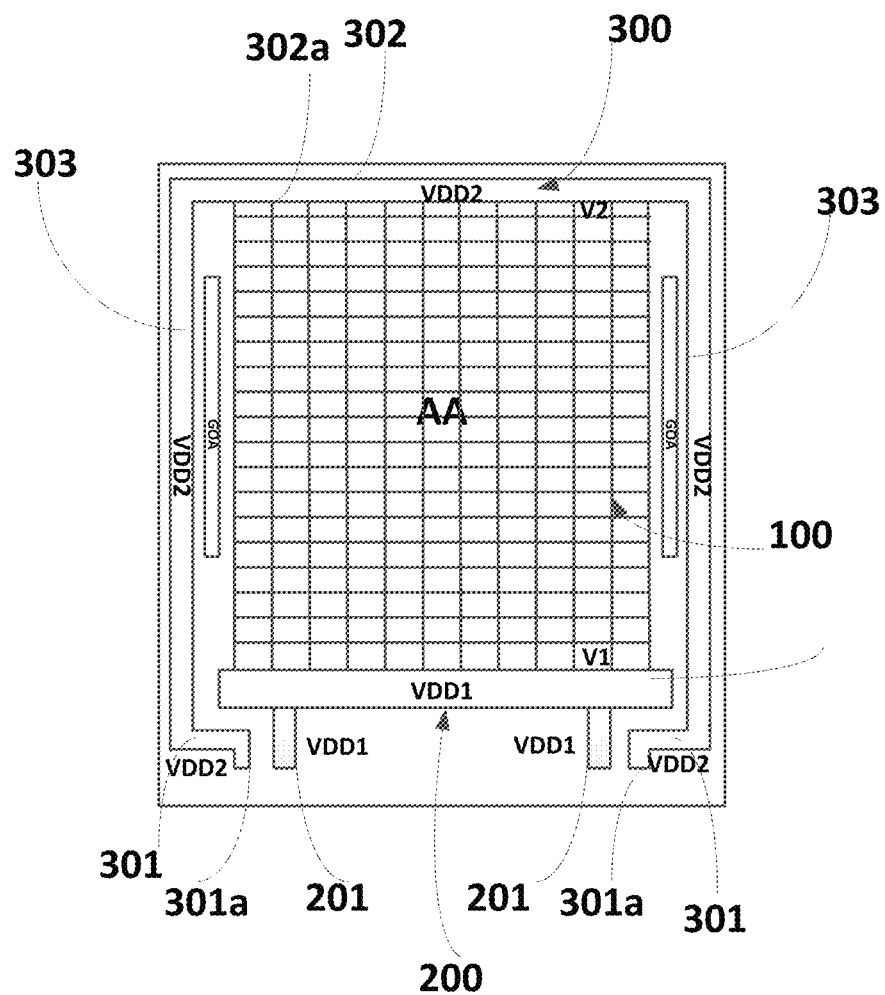
FIG. 1 is a schematic view of a display substrate according to an embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

An organic light-emitting diode (OLED) may be driven by using a passive matrix (PM) mode or an active matrix (AM) mode. As compared with the passive matrix mode, the active matrix mode has such advantages as much display information, low power consumption, long service life, and high image contrast. Along with the advancement of the times and technology, a large-size, high-resolution active matrix organic light-emitting display (AMOLED) device has gradually developed. Since there is a certain resistance in a panel power supply line, and a driving current of each pixel is applied through a driving power supply voltage signal Vdd line on a power supply line, a power supply voltage of the driving power supply voltage signal Vdd line in a region of a back plane close to a power supplying position is larger than that in a region away from the power supplying position. Such phenomenon is referred to as a voltage drop due to the resistance (IR Drop). For the large-size AMOLED device, a larger size panel and a larger number of pixels are required. Further, a length of a panel wire is getting longer and longer, and a wire resistance is also larger. Therefore, the IR Drop of the power supply voltage may inevitably occur on the power supply voltage line, so that power supply voltages applied to pixel circuits on the entire panel are different. Further, in the case of applying a same data signal voltage, the pixel circuits at different positions may output different currents and brightness, and thereby display brightness on the entire panel is uneven.

In view of problems such as different driving voltages of the pixel circuits at different positions and the uneven display brightness of the panel due to the relatively large voltage drop caused by the driving power supply voltage signal VDD line in the related art, a display substrate and a method for driving the display substrate are provided in the embodiment of the present disclosure, so as to achieve such technical effects as smaller voltage drop on the driving power supply voltage signal VDD line and more even display brightness.

Figure 3:
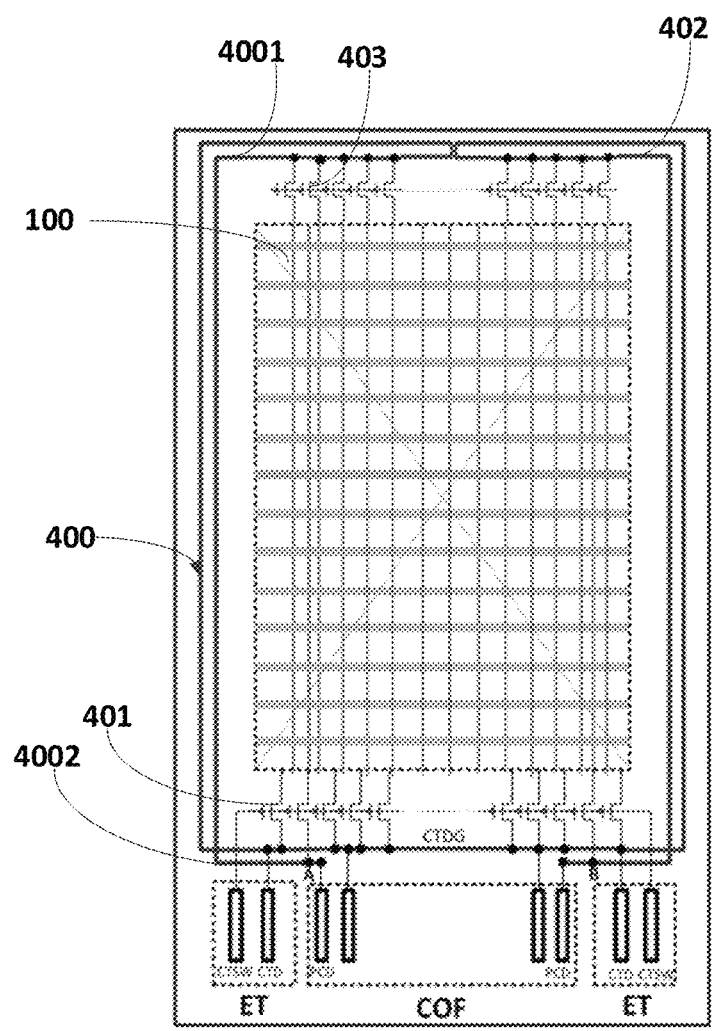
FIG. 3 is a schematic view of the display substrate according to another embodiment of the present disclosure.

As shown in FIG. 1 and FIG. 3, the display substrate includes: a plurality of pixel units defined by a plurality of gate lines crossing a plurality of data lines and arranged in an array and a power supply signal structure configured to apply a power supply voltage signal to each pixel unit. The power supply signal structure includes: a plurality of driving voltage signal VDD lines 100, a first power supply voltage signal VDD1 line 200 connected to a first end of each driving voltage signal VDD line 100, and configured to apply a first power supply voltage V1 to the first end of the driving voltage signal line, and a second power supply voltage signal VDD2 line 300 connected to a second end of the driving voltage signal VDD line 100, and configured to apply a power supply voltage V2 to the second end of the driving voltage signal VDD line 100.

In the display substrate of the present disclosure, the first power supply voltage V1 is applied to the first end of the driving voltage signal VDD line 100 through the first power supply voltage signal VDD1 line 200, and the second power supply voltage V2 is applied to the second end of the driving voltage signal VDD line 100 through the second power supply voltage signal VDD2 line 300. In other words, power supply voltage signals are applied to two ends of the driving voltage signal VDD line 100, so that values of power supply voltage signals applied to the first power supply voltage signal VDD1 line 200 and the second power supply voltage signal VDD2 line 300 may be adjusted, thereby to cause a value of the first power supply voltage V1 and a value of the second power supply voltage V2 at two ends of the driving voltage signal VDD line 100 respectively to be equal. That is, voltages at two ends of the driving voltage signal VDD line 100 are identical. As compared with the related art where a power supply voltage signal is applied to only one end of the driving voltage signal VDD line 100, it is able to improve the brightness evenness of the display substrate and solve the problem of uneven brightness caused by IR Drop.

The driving voltage signal VDD lines may be arranged in parallel with the data lines in a one-to-one correspondence.

The display substrate will be described hereinafter according to optional embodiments of the present disclosure.

FIG. 1 is a schematic view of the display substrate according to an optional embodiment of the present disclosure.

In an illustrative embodiment, as shown in FIG. 1, the display substrate includes a display region and a peripheral region, the display substrate includes a power supply input side and an opposite side opposite to the power supply input side, the power supply input side corresponds to the first end of the driving voltage signal VDD line 100, and the opposite side corresponds to the second end of the driving voltage signal VDD line 100. The first power supply voltage signal VDD1 line 200 is arranged in the peripheral region of the display substrate and located at the power supply input side, and includes a first power supply input end 201 and a first power supply output end, the first power supply input end 201 is electrically connected to a driving integrated circuit (IC) of the display substrate, and the first power supply output end is electrically connected to the first end of each driving voltage signal VDD line 100.

The first power supply voltage signal VDD1 line may be, but not limited to, arranged at the power input side of the display substrate, and connected to each driving voltage signal VDD line 100 through the first power input end, so as to apply a power supply voltage to the pixel units.

In an illustrative embodiment, as shown in FIG. 1, the second power supply voltage signal VDD2 line 300 is arranged in the peripheral region of the display substrate, at least a part of the second power supply voltage signal VDD2 line is located at the power supply input side and includes a second power supply input end at the power supply input side, the second power supply input end is electrically connected to the driving IC of the display substrate, at least another part of the second power supply voltage signal VDD2 line 300 is disposed around the display region and extends to the opposite side of the power supply input side, and includes a second power supply output end at the opposite side, and the second power supply output end is electrically connected to the second end of each driving voltage signal VDD line 100.

A wire may be added in the peripheral region of the display substrate in the related art to serve as the second power supply voltage signal VDD2 line 300, so as to apply a power supply voltage signal to the driving power supply voltage signal VDD line in the display region through the second power supply voltage signal VDD2 line 300. A value of the power supply voltage signal applied to the second power supply voltage signal VDD2 line 300 may be determined in the following manner.

Estimating, through a simulation method, a voltage drop value across the second power supply input end and the second power supply output end of the second power supply voltage signal VDD2 line 300, i.e., a voltage drop value on the power supply voltage signal VDD2 line 300 from the power supply input side of the display substrate to the opposite side.

Adjusting modules to enable a value of the first power supply voltage V1 applied through the first power supply voltage signal VDD1 line 200 to the first end of the driving voltage signal VDD line 100 to be substantially equal to a value of the second power supply voltage V2 applied through the second power supply voltage signal VDD2 line 300 to the second end of the driving voltage signal VDD line 100.

In addition, for example, as shown in FIG. 1, the second power supply voltage signal VDD2 line 300 includes a first horizontal line 301 arranged at the power supply input side and configured to be electrically connected to the driving IC of the display substrate, where the first horizontal line 301 is parallel to each gate line, and includes two second power supply input ends 301a; a second horizontal line 302 arranged at the opposite side and extending along a direction of each data line, where the second horizontal line 302 is parallel to the gate line, and includes one second power supply output end 302a corresponding to each driving voltage signal VDD line; and two vertical lines 303 connected to two ends of the second horizontal line 302 respectively, and parallel to the driving power supply voltage signal VDD line, where two ends of each vertical line 303 are connected to the first horizontal line 301 and the second horizontal line 302 respectively.

The second power supply voltage signal VDD2 line 300 is a wire around the display region. Two second power supply input ends 301*a* are provided at the power supply input side, a plurality of second power supply output ends 302*a* are provided on the second horizontal lines 302 at the opposite side, and the plurality of second power supply output ends 302*a* may be formed as output pins, so as to be connected to multiple driving voltage signal VDD lines 100 in a one-to-one correspondence, and apply a power supply voltage to the second end of each driving voltage signal VDD line 100.

In addition, for example, the first power supply voltage signal VDD1 line 200 and the second power supply voltage signal VDD2 line 300 are arranged at a same layer and made of a same material.

The first power supply voltage signal VDD1 line 200 and the second power supply voltage signal VDD2 line 300 may be formed in a same manufacturing process, so as to simplify the processes. Of course, it should be appreciated that, the second power supply voltage signal VDD2 line 300 may be at a different layer from the first power supply voltage signal VDD1 line in practical applications.

FIG. 3 is a schematic view of the display substrate according to an optional embodiment of the present disclosure.

As shown in FIG. 3, in an illustrative embodiment, the display substrate includes a display region and a peripheral region, the display substrate includes a power supply input side and an opposite side opposite to the power supply input side, the power supply input side corresponds to the first end of the driving voltage signal VDD line 100, and the opposite side corresponds to the second end of the driving voltage signal VDD line 100.

The display substrate further includes an electrical test line 400 configured to perform electrical test on the display substrate, and arranged in the peripheral region of the display substrate. The electrical test line 400 includes a test signal input end and a test signal output end, the test signal input end is arranged at the power supply input side, and the test signal output end is connected to each driving voltage signal VDD line 100 through a corresponding first switch 401. During a display substrate test phase, the first switch is turned on to connect the test signal output end with a data line, and during a pixel unit light-emitting phase, the first switch is turned off to disconnect the test signal output end from the data line.

At least a part of the electrical test line 400 is disposed around the display region and extends to the opposite side to form a horizontal line 402 in a same direction as each gate line, so as to reuse the electrical test line 400 as the second power supply voltage signal VDD2 line 300. A second switch 403 is provided corresponding to each driving voltage signal VDD line 100, and connected between the second end of the corresponding driving voltage signal VDD line 100 and the horizontal line 402. During the display substrate test phase, the second switch is turned off to disconnect the electrical test line 400 from the data line, and during the pixel unit light-emitting phase, the second switch is turned on to electrically connect the second end of the driving voltage signal VDD line 100 with the horizontal line 402 of the electrical test line 400.

In this way, a wire that has been arranged on the display substrate may be further properly used as the second power supply voltage signal VDD2 line 300, so as to apply a power supply signal to the second end of the driving voltage signal VDD line 100. The second switch 403 is added corresponding to each driving voltage signal VDD line 100 at the opposite side of the power supply input side of the display substrate.

During the display substrate test phase, the first switch 401 is turned on to connect the test signal output end with the data line, and the second switch 403 is turned off to disconnect the electrical test line 400 from the second end of the driving voltage signal VDD line 100, and apply a test electrical signal to the test signal input end, so as to apply a test signal to the pixel units.

During the pixel unit light-emitting phase, the first switch 401 is turned off to disconnect the test signal output end from the data line, and the second switch 403 is turned on to connect the second end of the driving voltage signal VDD line 100 with the horizontal line 402 of the electrical test line 400, and apply a second power supply voltage signal to the test signal input end, so as to apply a power supply voltage signal to the pixel units.

For example, the electrical test line 400 is a panel crack design line (PCD line).

Figure 2:
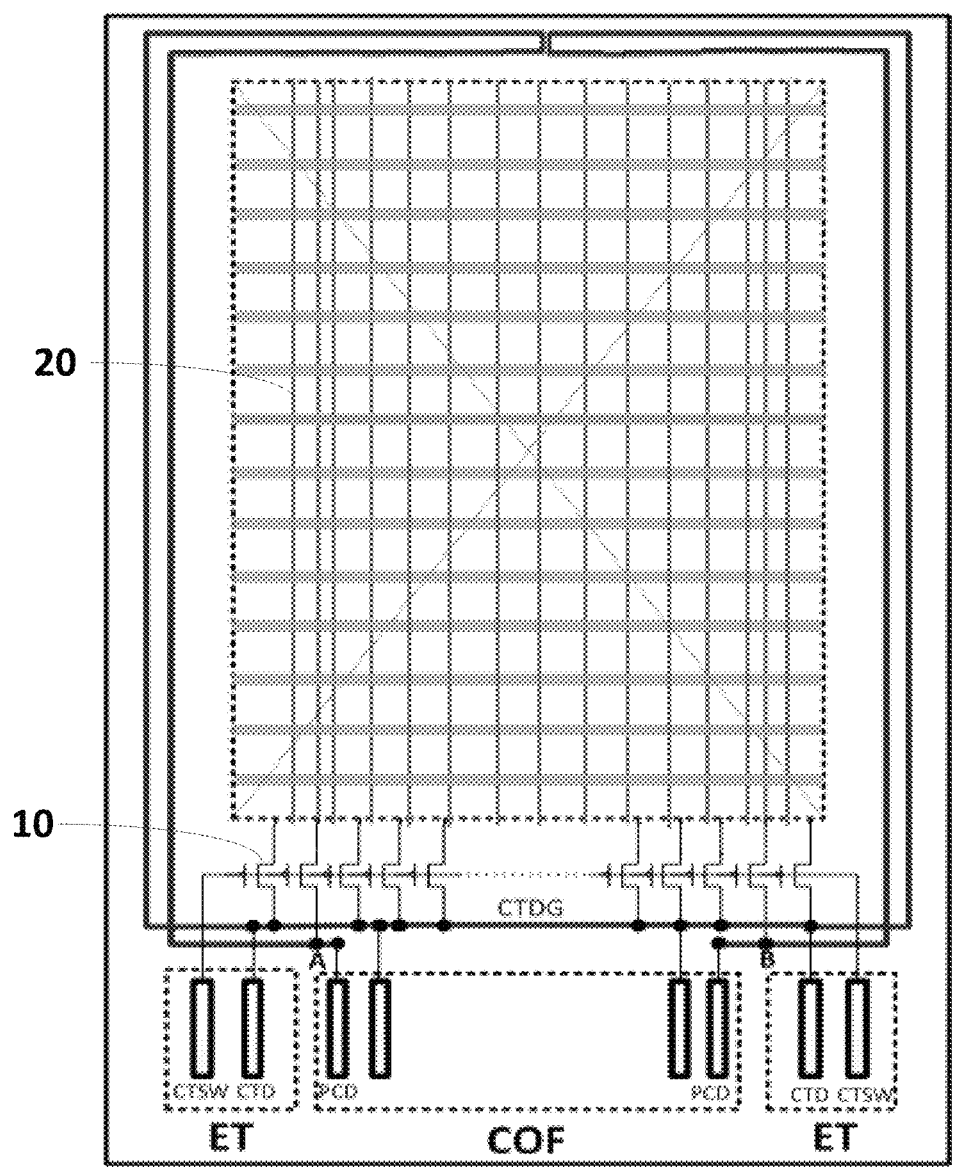
FIG. 2 is a schematic view of a display substrate in the related art.

FIG. 2 is a schematic view of a display substrate in the related art. As shown in FIG. 2, a panel crack design (PCD) line used for panel crack test in the related art is arranged in the peripheral region, and a test signal output end of the PCD line is connected to each driving voltage signal VDD line 20 through a TFT switch 10 at the power supply input side of the display substrate. During a display substrate test phase, the TFT switch is turned on, so that the test signal output end is connected to the driving voltage signal VDD line 20, thereby to apply a test signal to a test signal input end and perform a regular electrical test. During a pixel unit light-emitting phase, the TFT switch 10 is turned off, so that the test signal output end is disconnected from the driving voltage signal VDD line 20.

In the optional embodiment of the present disclosure, the PCD line used for panel crack test is reused as the second power supply voltage signal VDD2 line 300, as shown in FIG. 3, at least a part of the PCD line is disposed around the display region and extends to the opposite side to form the horizontal line 402 in the same direction as the data line, and the second switch 403 is added corresponding to each driving voltage signal VDD line 100, and connected between the second end of the corresponding driving voltage signal VDD line 100 and the horizontal line 402. In this way, a wiring structure may be simplified by reusing the PCD line as the second power supply voltage signal VDD2 line 300, so as to provide a narrow bezel design.

It should be appreciated that, the PCD line is reused as the second power supply voltage signal in the above-mentioned embodiment, which is merely for illustrative purposes, and other electrical test circuits 400 may also be reused as the second power supply voltage signal in practical applications.

In addition, for example, the first switch 401 is a first thin film transistor (TFT) switch, and the second switch 403 is a second TFT switch. In other embodiments, the first switch 401 and/or the second switch 403 may also each be a metal oxide semiconductor (MOS) switch, etc., which is not limited herein.

Taking that each of the first switch 401 and the second switch 403 is a TFT switch as an example, a gate electrode of the first TFT switch 401 is connected to a first switch signal line configured to apply a switch control signal to the first TFT switch 401, a source electrode of the first TFT switch 401 is connected to a data line, and a drain electrode of the first TFT switch 401 is connected to the test signal input end of the electrical test line. A gate electrode of the second TFT switch 403 is connected to a second switch signal line configured to apply a switch control signal to the second TFT switch 403, a source electrode of the second TFT switch 403 is connected to the horizontal line of the electrical test line, and a drain electrode of the second TFT switch 403 is connected to the driving voltage signal VDD line 100.

The gate electrode of the first TFT switch 401 may transmit a control signal through the first switch signal line, and control the first TFT switch 401 to be turned on or off, so as to control the data line to be connected to, or disconnected from, the electrical test line. The gate electrode of the second TFT switch 403 may transmit a control signal through the second switch signal line, and control the second TFT switch 403 to be turned on or off, so as to control the electrical test circuit to be connected to, disconnected from, the driving voltage signal VDD line 100.

It should be appreciated that the first switch signal line may be arranged separately, the second switch signal line may be controlled separately, or the first switch signal line and the second switch signal line may be associated (for example, through a same signal line), so that in the case that the first switch is turned off, the second switch is turned on, and in the case that the first switch is turned on, the second switch is turned off. In addition, for example, the source electrode and the drain electrode of the first TFT switch and the source electrode and the drain electrode of the second TFT switch are arranged at a same layer and made of a same material, and the gate electrode of the first TFT switch and the gate electrode of the second TFT switch are arranged at a same layer and made of a same material. Thus, the first TFT switch and the second TFT switch may be formed in a same patterning process, so as to simplify the processes.

Further, a method for driving the above-mentioned display substrate is further provided, including: applying a first power supply voltage signal to the first power supply voltage signal VDD1 line 200, such that the first power supply voltage signal VDD1 line applies the first power supply voltage V1 to the first end of the driving voltage signal line; and applying a second power supply voltage signal to the second power supply voltage signal VDD2 line 300, such that the second power supply voltage signal VDD2 line applies the second power supply voltage V2 to the second end of the driving voltage signal line, where a value of the first power supply voltage V1 is substantially equal to a value of the second power supply voltage V2.

In method for driving the display substrate of the present disclosure, the first power supply voltage V1 is applied to the first end of the driving voltage signal VDD line 100 through the first power supply voltage signal VDD1 line 200, and the second power supply voltage V2 is applied to the second end of the driving voltage signal VDD line 100 through the second power supply voltage signal VDD2 line 300. In other words, power supply voltage signals are applied to two ends of the driving voltage signal VDD line 100, so that values of power supply voltage signals applied to the first power supply voltage signal VDD1 line 200 and the second power supply voltage signal VDD2 line 300 may be adjusted, thereby to cause a value of the first power supply voltage V1 and a value of the second power supply voltage V2 at two ends of the driving voltage signal VDD line 100 respectively to be equal. That is, voltages at two ends of the driving voltage signal VDD line 100 are identical. As compared with the related art where a power supply voltage signal is applied to only one end of the driving voltage signal VDD line 100, it is able to improve the brightness evenness of the display substrate and solve the problem of uneven brightness caused by IR Drop.

For example, when the method is applied to the display substrate in FIG. 1, the method further includes: subsequent to the applying the first power supply voltage to the first power supply voltage signal VDD1 line 200, and prior to the applying the second power supply voltage to the second power supply voltage signal VDD2 line 300, determining a value of the second power supply voltage. The determining the value of the second power supply voltage includes: estimating, through a simulation method, a voltage drop value across the second power supply input end 301a and the second power supply output end 302a of the second power supply voltage signal VDD2 line 300, i.e., a voltage drop value on the power supply voltage signal VDD2 line 300 from the power supply input side of the display substrate to the opposite side, and adjusting modules to enable a value of the first power supply voltage V1 applied through the first power supply voltage signal VDD1 line 200 to the first end of the driving voltage signal VDD line 100 to be substantially equal to a value of the second power supply voltage V2 applied through the second power supply voltage signal VDD2 line 300 to the second end of the driving voltage signal VDD line 100, and determining a current power supply voltage signal applied to the second power supply voltage signal VDD2 line 300 as the second power supply voltage signal.

In addition, for example, when the method is applied to the display substrate in FIG. 3, the method further includes: during the display substrate test phase, turning on the first switch 401 to enable the test signal output end 4002 to be connected to a data line, and turning off the second switch 403 to disconnect the electrical test line 400 from the second end of the driving voltage signal VDD line, and apply a test electrical signal to the test signal input end 4001; and during the pixel unit light-emitting phase, turning off the first switch 401 to disconnect the test signal output end from the data line, and turning on the second switch 403 to connect the second end of the driving voltage signal VDD line 100 with the horizontal line 402 of the electrical test line 400, and apply a second power supply voltage signal to the test signal input end.

In this way, a wire that has been arranged on the display substrate may be further properly used as the second power supply voltage signal VDD2 line 300, so as to apply a power supply signal to the second end of the driving voltage signal VDD line 100. The second switch 403 is added corresponding to each driving voltage signal VDD line 100 at the opposite side of the power supply input side of the display substrate. During the display substrate test phase, the first switch 401 is turned on to connect the test signal output end with the data line, and the second switch 403 is turned off to disconnect the electrical test line 400 from the second end of the driving voltage signal VDD line 100, and apply a test electrical signal to the test signal input end, so as to apply a test signal to the pixel units.

During the pixel unit light-emitting phase, the first switch 401 is turned off to disconnect the test signal output end from the data line, and the second switch 403 is turned on to connect the second end of the driving voltage signal VDD line 100 with the horizontal line 402 of the electrical test line 400, and apply a second power supply voltage signal to the test signal input end, so as to apply a power supply voltage signal to the pixel units.

For example, the electrical test line 400 is a panel crack design line (PCD line).

It should be appreciated that when each of the first switch 401 and the second switch 403 is a TFT switch, the first switch 401 and the second switch 403 may be turned on or turned off by applying a control signal to the first switch 401 through the first switch signal line or applying a control signal to the second switch 403 through the second switch signal line respectively.

A display device is further provided, including the above-mentioned display substrate, a memory and a processor. The memory is configured to store instructions, and the processor is configured to execute the instructions to perform the above-mentioned method.

Some descriptions will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are merely for illustrative purposes, but shall not be construed as limiting the scope of the present disclosure. The scope of the present disclosure shall be subject to the scope defined by the appended claims.

What is claimed is:

1. A display substrate, comprising:
a plurality of gate lines;
a plurality of data lines;
a plurality of pixel units defined by the plurality of gate lines crossing the plurality of data lines and arranged in an array; and
a power supply signal structure configured to apply a power supply voltage signal to each pixel unit;
wherein the power supply signal structure comprises: a plurality of driving voltage signal VDD lines; a first power supply voltage signal VDD1 line connected to a first end of a driving voltage signal VDD line, and configured to apply a first power supply voltage V1 to the first end of the driving voltage signal line; and a second power supply voltage signal VDD2 line connected to a second end of the driving voltage signal VDD line, and configured to apply a power supply voltage V2 to the second end of the driving voltage signal VDD line,
wherein the display substrate comprises a display region and a peripheral region, the display substrate comprises a power supply input side and an opposite side opposite to the power supply input side, the power supply input side corresponds to the first end of the driving voltage signal VDD line, and the opposite side corresponds to the second end of the driving voltage signal VDD line;
the display substrate further comprises an electrical test line configured to perform electrical test on the display substrate, and arranged in the peripheral region of the display substrate, wherein the electrical test line comprises a test signal input end and a test signal output end, the test signal input end is arranged at the power supply input side, at least a part of the electrical test line is disposed around the display region and extends to the opposite side to form a horizontal line in a same direction as each gate line, so as to reuse the electrical test line as the second power supply voltage signal VDD2 line, and a second switch is provided corresponding to each driving voltage signal VDD line.

2. The display substrate according to claim 1, wherein the first power supply voltage signal VDD1 line is arranged in the peripheral region of the display substrate and located at the power supply input side, and comprises a first power supply input end and a first power supply output end, the first power supply input end is electrically connected to a driving integrated circuit (IC) of the display substrate, and the first power supply output end is electrically connected to the first end of each driving voltage signal VDD line.

3. The display substrate according to claim 2, wherein the second power supply voltage signal VDD2 line is arranged in the peripheral region of the display substrate, at least a part of the second power supply voltage signal VDD2 line is located at the power supply input side and comprises a second power supply input end at the power supply input side, the second power supply input end is electrically connected to the driving IC of the display substrate, at least another part of the second power supply voltage signal VDD2 line is disposed around the display region and extends to the opposite side of the power supply input side, and comprises a second power supply output end at the opposite side, and the second power supply output end is electrically connected to the second end of each driving voltage signal VDD line.

4. The display substrate according to claim 3, wherein the second power supply voltage signal VDD2 line comprises: a first horizontal line arranged at the power supply input side and configured to be electrically connected to the driving IC of the display substrate, wherein the first horizontal line is parallel to each gate line, and comprises two second power supply input ends; a second horizontal line arranged at the opposite side and extending along a direction of each data line, wherein the second horizontal line is parallel to the gate line, and comprises one second power supply output end corresponding to the position of each driving voltage signal VDD line; and two vertical lines connected to two ends of the second horizontal line respectively, wherein the vertical line is parallel to the driving power supply voltage signal VDD line, wherein two ends of each vertical line are connected to the first horizontal line and the second horizontal line respectively.

5. The display substrate according to claim 3, wherein the first power supply voltage signal VDD1 line and the second power supply voltage signal VDD2 line are arranged at a same layer and made of a same material.

6. The display substrate according to claim 1, wherein the test signal output end is connected to each data line through a corresponding first switch.

7. The display substrate according to claim 6, wherein
the first switch is a first thin film transistor (TFT) switch;
the second switch is a second TFT switch;
a gate electrode of the first TFT switch is connected to a first switch signal line configured to apply a switch control signal to the first TFT switch, a source electrode of the first TFT switch is connected to a data line, a drain electrode of the first TFT switch is connected to the test signal output end of the electrical test line;
a gate electrode of the second TFT switch is connected to a second switch signal line configured to apply a switch control signal to the second TFT switch, a source electrode of the second TFT switch is connected to the horizontal line of the electrical test line, a drain electrode of the second TFT switch is connected to the driving voltage signal VDD line;

the source electrode and the drain electrode of the first TFT switch and the source electrode and the drain electrode of the second TFT switch are arranged at a same layer and made of a same material; and the gate electrode of the first TFT switch and the gate electrode of the second TFT switch are arranged at a same layer and made of a same material.

8. A method for driving the display substrate according to claim 7, comprising:
during a display substrate test phase, turning on the first switch to connect the test signal output end with a data line, and turning off the second switch to disconnect the horizontal line of the electrical test line from the second end of the driving voltage signal VDD line, and apply a test electrical signal to the test signal input end; and
during a pixel unit light-emitting phase, turning off the first switch to disconnect the test signal output end from the data line, and turning on the second switch to connect the second end of the driving voltage signal VDD line with the horizontal line of the electrical test line, and apply a second power supply voltage signal to the test signal input end.

9. A method for driving the display substrate according to claim 6, comprising:
during a display substrate test phase, turning on the first switch to connect the test signal output end with a data line, and turning off the second switch to disconnect the horizontal line of the electrical test line from the second end of the driving voltage signal VDD line, and apply a test electrical signal to the test signal input end; and
during a pixel unit light-emitting phase, turning off the first switch to disconnect the test signal output end from the data line, and turning on the second switch to connect the second end of the driving voltage signal VDD line with the horizontal line of the electrical test line, and apply a second power supply voltage signal to the test signal input end.

10. The display substrate according to claim 1, wherein the electrical test line is a panel crack design line.

11. The display substrate according to claim 1, wherein a value of the first power supply voltage V1 is substantially equal to a value of the second power supply voltage V2.

12. A method for driving the display substrate according to claim 11, comprising:
during a display substrate test phase, turning on a first switch to connect the test signal output end with a data line, and turning off the second switch to disconnect the horizontal line of the electrical test line from the second end of the driving voltage signal VDD line, and apply a test electrical signal to the test signal input end; and
during a pixel unit light-emitting phase, turning off the first switch to disconnect the test signal output end from the data line, and turning on the second switch to connect the second end of the driving voltage signal VDD line with the horizontal line of the electrical test line, and apply a second power supply voltage signal to the test signal input end.

13. A method for driving the display substrate according to claim 1, comprising:
applying a first power supply voltage signal to the first power supply voltage signal VDD1 line, such that the first power supply voltage signal VDD1 line applies the first power supply voltage V1 to the first end of the driving voltage signal line; and
applying a second power supply voltage signal to the second power supply voltage signal VDD2 line, such that the second power supply voltage signal VDD2 line applies the second power supply voltage V2 to the second end of the driving voltage signal line.

14. The method for driving the display substrate according to claim 13, wherein a value of the first power supply voltage V1 is substantially equal to a value of the second power supply voltage V2.

15. A display device comprising:
a display substrate, a memory and a processor, wherein the display substrate comprises:
a plurality of gate lines;
a plurality of data lines;
a plurality of pixel units defined by the plurality of gate lines crossing the plurality of data lines and arranged in an array; and
a power supply signal structure configured to apply a power supply voltage signal to each pixel unit;
wherein the power supply signal structure comprises: a plurality of driving voltage signal VDD lines; a first power supply voltage signal VDD1 line connected to a first end of a driving voltage signal VDD line, and configured to apply a first power supply voltage V1 to the first end of the driving voltage signal line; and a second power supply voltage signal VDD2 line connected to a second end of the driving voltage signal VDD line, and configured to apply a power supply voltage V2 to the second end of the driving voltage signal VDD line;
wherein the memory is configured to store instructions, wherein the display substrate comprises a display region and a peripheral region, the display substrate comprises a power supply input side and an opposite side opposite to the power supply input side, the power supply input side corresponds to the first end of the driving voltage signal VDD line, and the opposite side corresponds to the second end of the driving voltage signal VDD line;
the display substrate further comprises an electrical test line configured to perform electrical test on the display substrate, and arranged in the peripheral region of the display substrate, wherein the electrical test line comprises a test signal input end and a test signal output end, the test signal input end is arranged at the power supply input side, at least a part of the electrical test line is disposed around the display region and extends to the opposite side to form a horizontal line in a same direction as each gate line, so as to reuse the electrical test line as the second power supply voltage signal VDD2 line, and a second switch is provided corresponding to each driving voltage signal VDD line.

16. The display device according to claim 15, wherein the processor is configured to execute the instructions to control a value of the first power supply voltage V1 to be substantially equal to a value of the second power supply voltage V2.

17. The display device according to claim 15, further comprising a driving integrated circuit (IC),
wherein the first power supply voltage signal VDD1 line is arranged in the peripheral region of the display substrate and located at the power supply input side, and comprises a first power supply input end and a first power supply output end, the first power supply input end is electrically connected to the driving IC, and the first power supply output end is electrically connected to the first end of each driving voltage signal VDD line;
the second power supply voltage signal VDD2 line is arranged in the peripheral region of the display substrate, at least a part of the second power supply voltage signal VDD2 line is located at the power supply input side and comprises a second power supply input end at the power supply input side, the second power supply input end is electrically connected to the driving IC, at least another part of the second power supply voltage signal VDD2 line is disposed around the display region and extends to the opposite side of the power supply input side, and comprises a second power supply output end at the opposite side, and the second power supply output end is electrically connected to the second end of each driving voltage signal VDD line; and the processor is configured to:

calculate a voltage drop value across the second power supply input end and the second power supply output end of the second power supply voltage signal VDD2 line; and according to the voltage drop value, control the driving IC to adjust at least one of power supply voltage signal values applied to the first power supply input end and the second power supply input end, to enable a value of the first power supply voltage V1 outputted by the first power supply output end to be substantially equal to a value of the second power supply voltage V2 outputted by the second power supply output end.

18. The display device according to claim 15, wherein the test signal output end is connected to each data line through a corresponding first switch; and the processor is configured to:

during a test phase, turn on the first switch to connect the test signal output end with a data line, and turn off the second switch to disconnect the horizontal line of the electrical test line from the second end of the driving voltage signal VDD line, and apply a test electrical signal to the test signal input end; and during a pixel unit light-emitting phase, turn off the first switch to disconnect the test signal output end from the data line, and turn on the second switch to connect the second end of the driving voltage signal VDD line with the horizontal line of the electrical test line, and apply a second power supply voltage signal to the test signal input end.

19. A method for driving a display substrate, wherein the display substrate comprises: a plurality of gate lines; a plurality of data lines; a plurality of pixel units defined by the plurality of gate lines crossing the plurality of data lines and arranged in an array; and a power supply signal structure configured to apply a power supply voltage signal to each pixel unit;

wherein the power supply signal structure comprises: a plurality of driving voltage signal VDD lines; a first power supply voltage signal VDD1 line connected to a first end of a driving voltage signal VDD line, and configured to apply a first power supply voltage V1 to the first end of the driving voltage signal line; and a second power supply voltage signal VDD2 line connected to a second end of the driving voltage signal VDD line, and configured to apply a power supply voltage V2 to the second end of the driving voltage signal VDD line, wherein a value of the first power supply voltage V1 is substantially equal to a value of the second power supply voltage V2;

wherein the method comprises:

during a display substrate test phase, turning on a first switch to connect a test signal output end with a data line, and turning off a second switch to disconnect a horizontal line of an electrical test line from the second end of the driving voltage signal VDD line, and apply a test electrical signal to a test signal input end; and during a pixel unit light-emitting phase, turning off the first switch to disconnect the test signal output end from the data line, and turning on the second switch to connect the second end of the driving voltage signal VDD line with the horizontal line of the electrical test line, and apply a second power supply voltage signal to the test signal input end.

\* \* \* \* \*